US012660413B2

(12) United States Patent
Kim et al.

(10) Patent No.: US 12,660,413 B2
(45) Date of Patent: Jun. 16, 2026

(54) DISPLAY DEVICE AND METHOD OF PROVIDING THE SAME

(71) Applicant: Samsung Display Co., LTD., Yongin-si (KR)

(72) Inventors: Woongsik Kim, Hwaseong-si (KR); Jin-Su Byun, Seoul (KR); Jungi Kim, Hwaseong-si (KR); Donghwan Bae, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 875 days.

(21) Appl. No.: 17/961,631

(22) Filed: Oct. 7, 2022

(65) Prior Publication Data

US 2023/0122774 A1     Apr. 20, 2023

(30) Foreign Application Priority Data

Oct. 14, 2021     (KR) ........................ 10-2021-0136422

(51) Int. Cl.
| | |
|---|---|
| *H10K 50/858* | (2023.01) |
| *H10K 59/122* | (2023.01) |
| *H10K 59/38* | (2023.01) |
| *H10K 71/00* | (2023.01) |

(52) U.S. Cl.
CPC ......... *H10K 50/858* (2023.02); *H10K 59/122* (2023.02); *H10K 59/38* (2023.02); *H10K 71/00* (2023.02)

(58) Field of Classification Search
None
See application file for complete search history.

(56) References Cited

U.S. PATENT DOCUMENTS

| | | | | |
|---|---|---|---|---|
| 6,072,450 | A | 6/2000 | Yamada et al. | |
| 7,535,646 | B2 | 5/2009 | Chari et al. | |
| 9,368,757 | B2 * | 6/2016 | Choi ...................... | H10K 59/87 |
| 2015/0333108 | A1 | 11/2015 | Miyamoto et al. | |
| 2020/0119113 | A1 | 4/2020 | Lee et al. | |
| 2020/0144550 | A1 * | 5/2020 | Lee ...................... | H10K 50/865 |
| 2020/0350516 | A1 | 11/2020 | An et al. | |
| 2021/0143235 | A1 * | 5/2021 | Byun ...................... | H10K 59/40 |
| 2022/0037414 | A1 * | 2/2022 | Kim ...................... | H10K 59/38 |

(Continued)

FOREIGN PATENT DOCUMENTS

| | | |
|---|---|---|
| KR | 1020190086605 A | 7/2019 |
| KR | 20200042981 A | 4/2020 |
| KR | 1020200051883 A | 5/2020 |

(Continued)

OTHER PUBLICATIONS

Korean Office Action for Korean Patent Application No. 10-2021-0136422 dated Nov. 26, 2025.

*Primary Examiner* — Michelle Mandala
(74) *Attorney, Agent, or Firm* — CANTOR COLBURN LLP

(57) ABSTRACT

A display device includes a light emitting layer, a high refractive index member on the light emitting layer, overlapping the light emitting layer and including a first pattern defining a concave portion recessed in a cross-section, and a low refractive index member on the high refractive index member, covering the high refractive index member and having a second refractive index smaller than a first refractive index of the high refractive index member.

20 Claims, 18 Drawing Sheets

(56)      References Cited

U.S. PATENT DOCUMENTS

2023/0116030  A1 *   4/2023  Sui ...................... H10K 59/879
                                                                257/40
2023/0317894  A1 *  10/2023  Nakamura  ......... H10H 20/8514
                                                                257/98

FOREIGN PATENT DOCUMENTS

KR            20200127103  A      11/2020
KR          1020210010053  A       1/2021
KR            20210057877  A       5/2021

* cited by examiner

DISPLAY DEVICE AND METHOD OF PROVIDING THE SAME

This application claims priority to Korean Patent Application No. 10-2021-0136422, filed on Oct. 14, 2021, and all the benefits accruing therefrom under 35 U.S.C. § 119, which is hereby incorporated by reference for all purposes as if fully set forth herein.

BACKGROUND

1. Field

Embodiments of the invention relate to a display device and method of manufacturing (or providing) the same.

2. Description of the Related Art

A display device may display an image using a light emitting element. In the display device, light generated from the light emitting layer of the light emitting device is directed toward a front direction of the display device at which an image is viewable from outside the display device.

SUMMARY

Within a display device, the light generated in the light emitting layer of light emitting element travels in several directions including a front direction and a side direction of the display device. Accordingly, the luminance in the front direction of the display device, from which the light (and the image) may be viewed, may be lowered.

Embodiments of the invention provide a display device with improved light efficiency.

Embodiments of the invention also provide a method of manufacturing (or providing) the display device.

Additional features of the invention will be set forth in the description which follows, and in part will be apparent from the description, or may be learned by practice of the invention.

A display device according to an embodiment includes a substrate, a light emitting layer on the substrate; a high refractive index member on the light emitting layer, overlapping the light emitting layer and including a first pattern defining a concave portion recessed in a cross-section, and a low refractive index member on the high refractive index member, covering the high refractive index member and having a second refractive index smaller than a first refractive index of the high refractive index member.

In an embodiment, the high refractive index member may have a lower surface, and the concave portion of the first pattern may be in contact with the lower surface of the high refractive index member.

In an embodiment, the concave portion of the first pattern may have a dot shape when viewed in a plan view.

In an embodiment, the concave portion of the first pattern may have a linear shape when viewed in a plan view In an embodiment, the concave portion of the first pattern may have a closed curve shape when viewed in a plan view.

In an embodiment, the concave portion of the first pattern may be provided in plural.

In an embodiment, the high refractive index member further may include a second pattern extending from the first pattern and overlapping a pixel defining layer, and the second pattern may define a convex portion protruding in a cross-section.

In an embodiment, the convex portion of the second pattern may surround the first pattern when viewed in a plan view.

In an embodiment, the light emitting layer may emit an incident light directed to the convex portion of the second pattern, and the convex portion of the second pattern may refract the incident light in a normal direction of the substrate.

In an embodiment, the convex portion of the second pattern may be provided in plural.

In an embodiment, the first refractive index of the high refractive index member may be about 1.6 or more.

In an embodiment, each of the high refractive index member and the low refractive index member may include an organic material.

A display device according to an embodiment includes a substrate, a light emitting layer on the substrate, a color filter on the light emitting layer, overlapping the light emitting layer and including a first pattern defining a concave portion recessed in a cross-section, and a low refractive index member on the color filter, covering the high refractive index member and having a second refractive index smaller than a first refractive index of the color filter.

In an embodiment, the color filter may have a lower surface, and the concave portion of the first pattern may be in contact with the lower surface of the color filter.

In an embodiment, the concave portion of the first pattern may be provided in plural.

In an embodiment, the color filter further may include a second pattern extending from the first pattern and overlapping a pixel defining layer, and the second pattern may define a convex portion protruding in a cross-section.

In an embodiment, the convex portion of the second pattern may surround the first pattern when viewed in a plan view.

In an embodiment, the light emitting layer may emit an incident light directed to the convex portion of the second pattern, and the convex portion of the second pattern may refract the incident light in a normal direction of the substrate.

In an embodiment, the convex portion of the second pattern may be provided plural.

A method of providing a display device includes providing a light emitting layer on a substrate, providing a high refractive index member on the light emitting layer, where the high refractive index overlaps the light emitting layer and includes a first pattern defining a concave portion recessed in a cross-section, and providing a low refractive index member on the light emitting layer, where the low refractive member has a second refractive index smaller than the first refractive index of the high refractive index member.

According to one or more embodiment of the display device, a high refractive index member may precede a low refractive index member in a light emitting direction of light emitted from a light emitting layer. The high refractive index member may include a first pattern overlapping the light emitting layer, and a second pattern overlapping the pixel defining layer. The first pattern may include the concave portion, and the second pattern may include the convex portion.

The low refractive index member may be on the high refractive index member and cover the high refractive index member. In addition, the low refractive index member may have the second refractive index smaller than the first refractive index of the high refractive index member. The concave portion of the first pattern may refract incident light directed to the concave portion to be directed in a normal direction of the substrate. In addition, the convex portion of the second pattern may refract other incident light directed to the convex portion to be directed in the normal direction of the substrate. Accordingly, light may be emitted to the front of the display device, and the light efficiency of the display device may be improved.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the invention.

FIG. 2 is a cross-sectional view illustrating the display device of FIG. 1.

FIGS. 11 to 13 are cross-sectional views illustrating a method of providing the display device of FIG. 1, according to an embodiment.

FIG. 15 is a cross-sectional view illustrating the display device of FIG. 14.

FIG. 18 is a cross-sectional view illustrating the display device of FIG. 17.

FIG. 21 is a cross-sectional view illustrating the display device of FIG. 20.

DETAILED DESCRIPTION

Figure 1:
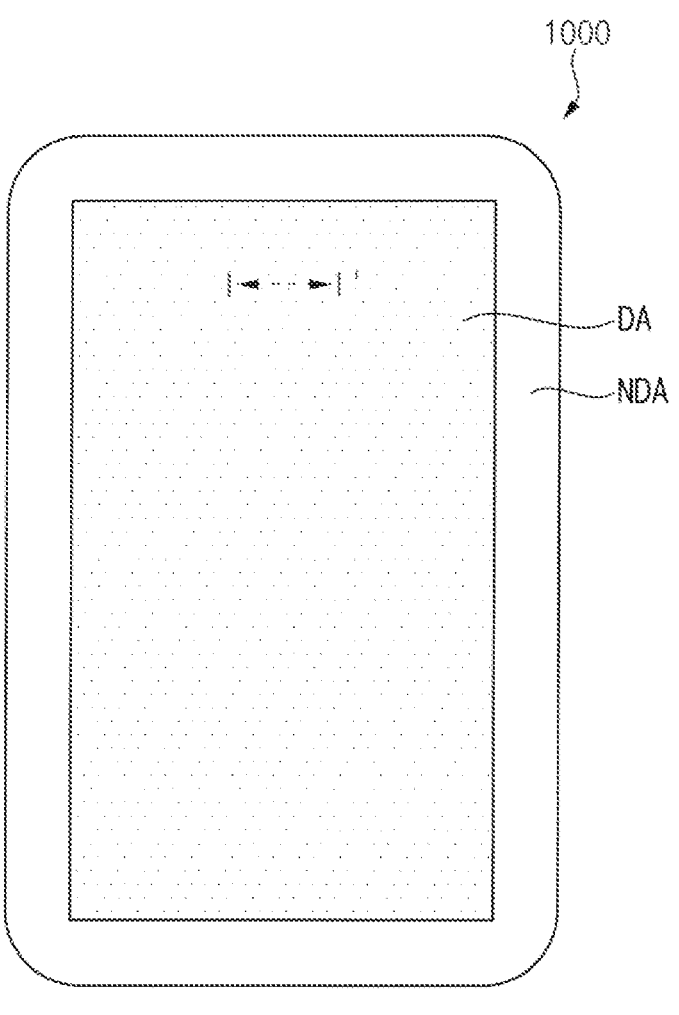
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on"

another element, it can be directly on the other element or intervening elements may be present therebetween. In contrast, when an element is referred to as being related to another element such as "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. As used herein, a reference number may indicate a singular element or a plurality of the element. For example, a reference number labeling a singular form of an element within the drawing figures may be used to reference a plurality of the singular element within the text of specification.

"At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Illustrative, non-limiting embodiments will be more clearly understood from the following detailed description in conjunction with the accompanying drawings.

FIG. 1 is a plan view illustrating a display device 1000 according to an embodiment.

Referring to FIG. 1, a display device 1000 according to an embodiment may be divided into a display area DA and a non-display area NDA. In an embodiment, for example, the display area DA may have a rectangular shape, and the non-display area NDA may be adjacent to the display area DA. The non-display area NDA may surround the display area DA, without being limited thereto. At least one pixel may be disposed in the display area DA, and an image may be displayed through the pixel in the display area DA, by driving the pixels. Drivers for driving the pixel may be disposed in the non-display area NDA. The drivers may provide a signal (e.g., an electrical signal) and/or a voltage to the pixel. The pixel may emit light in response to the signal and/or the voltage.

Figure 2:
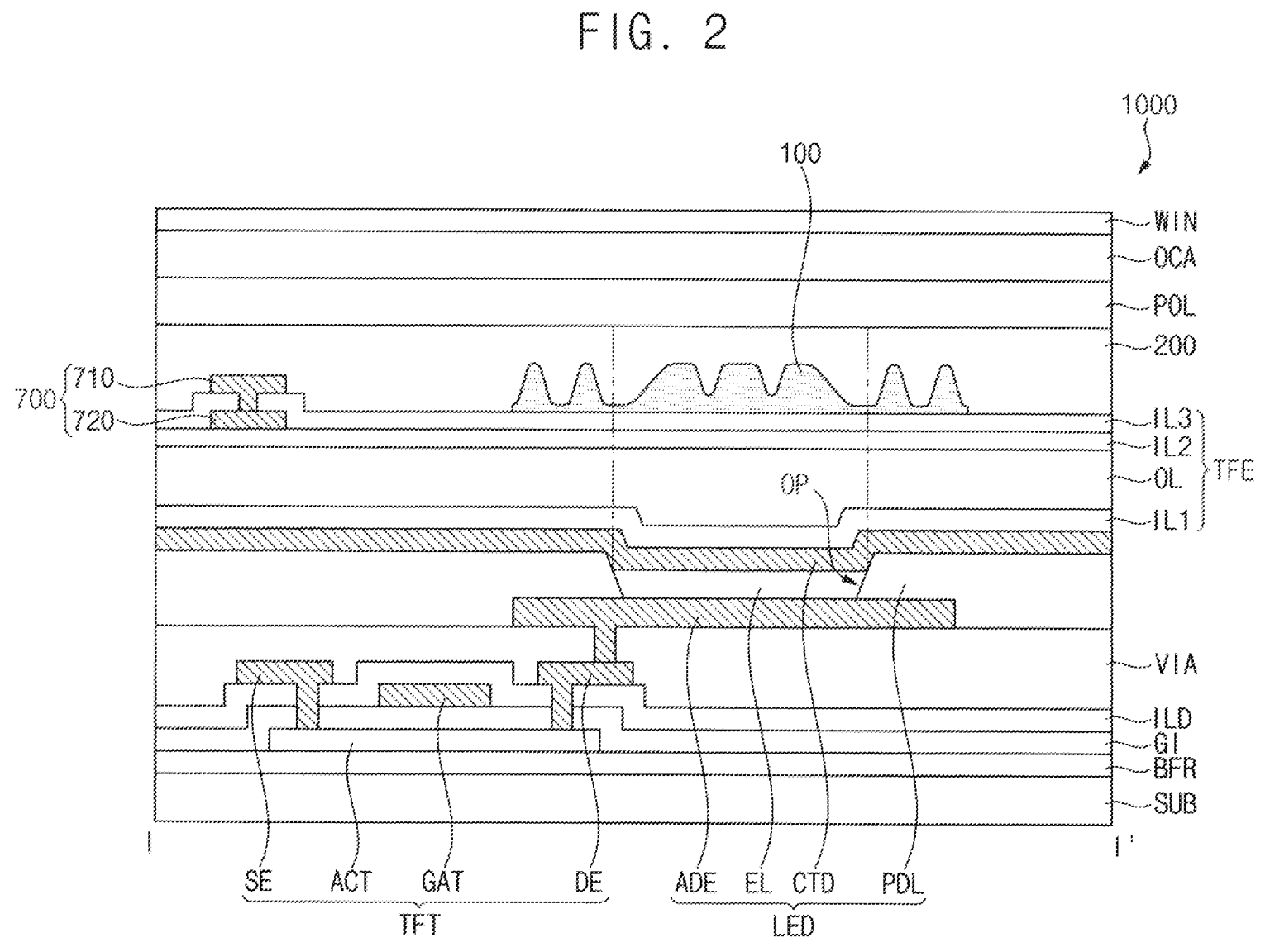

FIG. 2 is a cross-sectional view illustrating the display device 1000 of FIG. 1. In an embodiment, for example, FIG. 2 is a cross-sectional view taken along line I-I' of FIG. 1. The display device 1000 may be disposed in a plane defined by a first direction and a second direction which cross each other. In an embodiment, a horizontal direction and a vertical direction in FIG. 1 may variously represent the first direction and the second direction, without being limited thereto. A vertical direction in FIG. 2 may represent a thickness direction (e.g., a third direction) of the display device 1000, which crosses each of the first and second directions.

Referring to FIG. 2, the display device 1000 may include a substrate SUB, a buffer layer BFR, an active pattern ACT, a gate insulating layer GI, a gate electrode GAT, an interlayer insulating layer ILD, a source electrode SE, a drain electrode DE, a via insulating layer VIA, a first electrode ADE, a pixel defining layer PDL, a light emitting layer EL, a second electrode CTD, a first inorganic layer ILL an organic layer OL, a second inorganic layer IL2, a first touch electrode 710, a third inorganic layer IL3, a second touch electrode 720, a high refractive index member 100 (e.g., high refractive index pattern), a low refractive index member 200 (e.g., low refractive index layer), a polarization layer POL, an adhesive layer OCA, and a window WIN.

The substrate SUB may include a transparent or opaque material. In an embodiment, examples of the material that can be used as the substrate SUB may include glass, quartz, plastic, or the like. These may be used alone or in combination with each other. When the substrate SUB is formed of (or includes) glass having rigidity, the display device 1000 may be implemented as a rigid display device. When the substrate SUB is formed of flexible plastic, the display device 1000 may be implemented as a flexible display device.

The buffer layer BFR may be disposed on the substrate SUB. The buffer layer BFR may prevent diffusion of metal atoms or impurities from the substrate SUB to the active pattern ACT. In addition, the buffer layer BFR may control a heat supply rate during a crystallization process for forming the active pattern ACT. In an embodiment, the buffer layer BFR may be formed of an insulating material. Examples of the insulating material that can be used as the buffer layer BFR may include silicon oxide, silicon nitride, silicon oxynitride, and the like. These may be used alone or in combination with each other.

The active pattern ACT may be disposed on the buffer layer BFR. In an embodiment, the active pattern ACT may be formed of a silicon semiconductor material or an oxide semiconductor material. Examples of the silicon semiconductor material that may be used as the active pattern ACT may include amorphous silicon, polycrystalline silicon, or the like.

The gate insulating layer GI may be disposed on the active pattern ACT and may cover the active pattern ACT. In an embodiment, the gate insulating layer GI may be formed of an insulating material. Examples of the insulating material that can be used as the gate insulating layer GI may include silicon oxide, silicon nitride, silicon oxynitride, and the like. These may be used alone or in combination with each other.

The gate electrode GAT may be disposed on the gate insulating layer GI and may overlap the active pattern ACT. In an embodiment, the gate electrode GAT may be formed of a metal, an alloy, a conductive metal oxide, a transparent conductive material, or the like. Examples of the material that can be used as the gate electrode GAT include silver Ag, an alloy containing silver, molybdenum Mo, an alloy containing molybdenum, aluminum Al, and an alloy containing aluminum, aluminum nitride AlN, tungsten W, tungsten nitride WN, copper Cu, nickel Ni, chromium Cr, chromium nitride CrN, titanium Ti, tantalum Ta, platinum Pt, scandium Sc, indium tin oxide (ITO), indium zinc oxide (IZO) and the like. These may be used alone or in combination with each other.

The interlayer insulating layer ILD may be disposed on the gate electrode GAT and may cover the gate electrode GAT. In an embodiment, the interlayer insulating layer ILD may be formed of an insulating material.

Each of the source electrode SE and the drain electrode DE may be disposed on the interlayer insulating layer ILD and may be in contact with the active pattern ACT. In an embodiment, the source electrode SE and the drain electrode DE may be formed of a metal, an alloy, a conductive metal oxide, a transparent conductive material, or the like.

The active pattern ACT, the gate electrode GAT, the source electrode SE, and the drain electrode DE may together constitute a transistor TFT. The transistor TFT may generate a driving current (e.g., electrical driving current) and supply the driving current to the light emitting structure LED as a light emitting element.

The via insulating layer VIA may be disposed on the source electrode SE and the drain electrode DE, and may cover the source electrode SE and the drain electrode DE. The via insulating layer VIA may be formed of an insulating material. Examples of the insulating material that can be used as the via insulating layer VIA include photoresist, polyacrylic resin, polyimide-based resin, acrylic resin, epoxy-based resin, acrylate-based resin, and the like. These may be used alone or in combination with each other.

The first electrode ADE may be disposed on the via insulating layer VIA and may be in contact with the drain electrode DE, to be electrically connected thereto. The first electrode ADE may be a reflective electrode or a transparent electrode. In an embodiment, the first electrode ADE may be formed of a metal, an alloy, a conductive metal oxide, a transparent conductive material, or the like.

The pixel defining layer PDL may be disposed on the first electrode ADE. An opening OP exposing the first electrode ADE may be defined in or defined by the pixel defining layer PDL. Accordingly, the opening OP may define a light emitting area of the light emitting structure LED. The pixel defining layer PDL may be formed of an insulating material. Examples of the insulating material that can be used as the pixel defining layer PDL include photoresists, polyacrylic resins, polyimide resins, acrylic resins, epoxy resins, acrylate resins, and the like. These may be used alone or in combination with each other.

The light emitting layer EL may be disposed in the opening OP on the first electrode ADE. The light emitting layer EL may be formed of a material that emits light by an electric current applied thereto. Due to a potential difference between the first electrode ADE and the second electrode CTD, the light emitting layer EL may emit light.

The second electrode CTD may be disposed on the light emitting layer EL. In an embodiment, for example, the second electrode CTD may be formed as a plate or may be a transparent electrode. In an embodiment, the second electrode CTD may be formed of a metal, an alloy, a conductive metal oxide, a transparent conductive material, or the like.

The first electrode ADE, the pixel defining layer PDL, the light emitting layer EL, and the second electrode CTD together may constitute the light emitting structure LED.

The light emitting structure included in the display device 1000 may not be limited to the light emitting structure LED. In an embodiment, for example, the light emitting structure may be a light emitting diode including at least one of a micro light emitting diode (micro-LED), a nano light emitting diode (nano-LED), a quantum dot (QD), and a quantum rod (QR).

The first inorganic layer IL1 may be disposed on the second electrode CTD. In an embodiment, the first inorganic layer IL1 may be formed of an inorganic material. Examples of the insulating material that can be used as the first inorganic layer IL1 include silicon oxide, silicon nitride, silicon oxynitride, and the like. These may be used alone or in combination with each other.

The organic layer OL may be disposed on the first inorganic layer ILL In an embodiment, the organic layer OL may be formed of an organic material. Examples of the organic material that can be used as the organic layer OL may include a photoresist, a polyacrylic resin, a polyimide-based resin, an acrylic resin, an epoxy-based resin, and an acrylate-based resin, and the like. These may be used alone or in combination with each other.

The second inorganic layer IL2 may be disposed on the organic layer OL. In an embodiment, the second inorganic layer IL2 may be formed of an inorganic material.

The first inorganic layer ILL the organic layer OL, and the second inorganic layer IL2 may together constitute an encapsulation layer TFE. The encapsulation layer TFE may prevent impurities from penetrating into the light emitting structure LED. The encapsulation layer TFE is not limited to the above-described structure. In an embodiment, for example, the encapsulation layer TFE may be implemented as a single layer (e.g., monolayer).

The first touch electrode 710 may be disposed on the second inorganic layer IL2. In an embodiment, the first touch electrode 710 may extend in a first direction on a plane. The first touch electrode 710 may be formed of a metal, an alloy, a conductive metal oxide, a transparent conductive material, or the like.

The third inorganic layer IL3 may be disposed on the first touch electrode 710 and cover the first touch electrode 710. In an embodiment, the third inorganic layer IL3 may be formed of an insulating material.

The second touch electrode 720 may be disposed on the third inorganic layer IL3 and overlap the first touch electrode 710. In an embodiment, the second touch electrode 720 may extend in a second direction crossing the first direction on a plane. The first touch electrode 710 may be formed of a metal, an alloy, a conductive metal oxide, a transparent conductive material, or the like.

The first touch electrode 710 and the second touch electrode 720 may together constitute a sensing layer 700 (e.g., input sensing layer). The sensing layer 700 may detect a change in capacitance formed between the first touch electrode 710 and the second touch electrode 720, in response to an external input applied to the sensing layer 700. Accordingly, the sensing layer 700 may function as an input means of the display device 1000.

The polarization layer POL may be disposed on the low refractive index member 200. The polarization layer POL may polarize light. Accordingly, the polarization layer POL suppresses reflection of external light, thereby improving the optical efficiency of the display device 1000.

The adhesive layer OCA may be disposed on the polarization layer POL, and may adhere the polarization layer POL and the window WIN to each other. However, the polarization layer POL and the adhesive layer OCA may be omitted.

The window WIN may be disposed on the adhesive layer OCA. Examples of the material that can be used as the window WIN may include glass, quartz, plastic, or the like. These may be used alone or in combination with each other. The window WIN may protect the above-described components from external forces.

Figure 3:
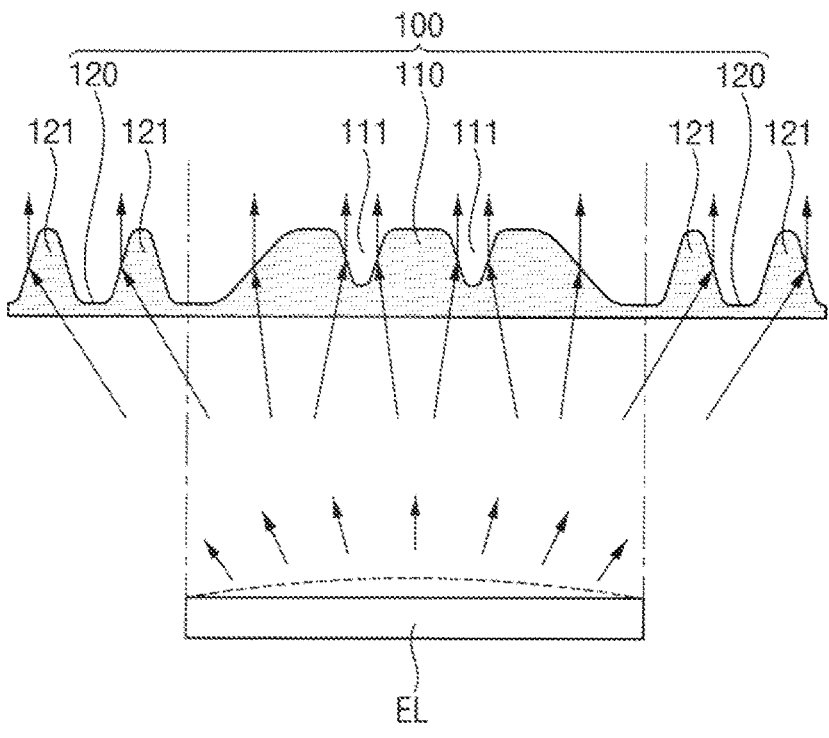
FIG. 3 is a view illustrating a light emitting layer and a high refractive index member included in the display device of FIG. 2.

FIG. 3 is a view illustrating a light emitting layer EL and a high refractive index member 100 included in the display device 1000 of FIG. 2.

Referring to FIGS. 2 and 3, the high refractive index member 100 may be disposed on the third inorganic layer IL3. The high refractive index member 100 may face the substrate SUB with the light emitting structure LED therebetween.

The high refractive index member 100 may include a first pattern 110 overlapping (or corresponding to) the light emitting layer EL and a second pattern 120 overlapping the pixel defining layer PDL.

The first pattern 110 may include at least one concave portion 111 recessed toward the light emitting structure LED, in a cross-section. In an embodiment, the concave portion 111 (e.g., first concave portion or first recess) may be singular. In an embodiment, the concave portion 111 may be plural. The first pattern 110 may define a plurality of first concave portions respectively between a plurality of first convex portions.

The second pattern 120 may include at least one convex portion 121 protruding in a direction away from the light emitting structure LED, in the cross-section. In an embodiment, the convex portion 121 (e.g., second convex portion) may be singular. In an embodiment, the convex portion 121 may be plural. The second pattern 120 may define a plurality of second convex portions between a plurality of second concave portions.

The low refractive index member 200 may be disposed on the high refractive index member 100 and cover the high refractive index member 100. That is, the low refractive index member 200 may be disposed facing the light emitting structure LED with the high refractive index member 100 therebetween. The low refractive index member 200 may form an interface with the high refractive index member 100, such as at various concave portions and convex portions thereof. Light may be refracted at such interfaces, without being limited thereto.

The high refractive index member 100 may have a first refractive index. Also, the low refractive index member 200 may have a second refractive index smaller than the first refractive index of the high refractive index member 100.

Each of the high refractive index member 100 and the low refractive index member 200 may include an organic material.

Referring to FIG. 3, the light emitting layer EL may emit the light in a plurality of directions, including a normal direction with respect to the substrate SUB. In an embodiment, for example, the light emitting layer EL may emit incident light directed to the concave portion 111 of the first pattern 110. Referring to the arrows illustrated in FIG. 3, for example, the light emitting layer EL may emit other incident light directed to the convex portion 121 of the second pattern 120.

The concave portion 111 of the first pattern 110 may refract incident light directed to the concave portion 111, and change the incident light direction to the normal direction of the substrate SUB. In addition, the convex portion 121 of the second pattern 120 may refract other incident light directed to the convex portion 121, and change the other light direction to the normal direction of the substrate SUB. Accordingly, emitted light may be emitted to the front of the display device 1000, at both the concave portion 111 and the convex portion 121, and the light efficiency of the display device 1000 may be improved.

In an embodiment, the first refractive index of the high refractive index member 100 may be about 1.6 or more. Also, the low refractive index member 200 may be a solid portion of a material layer or may be air.

Figure 7:
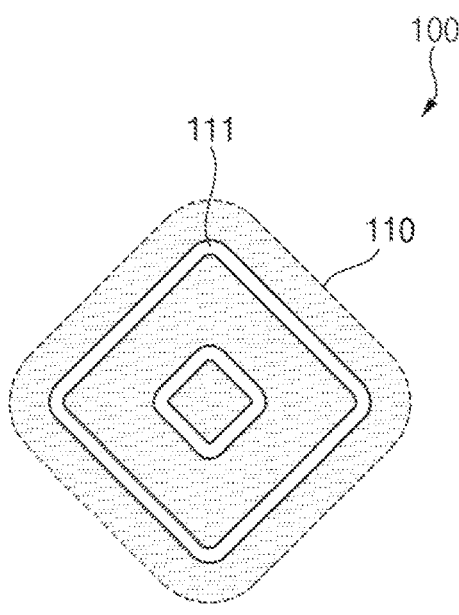
Figure 8:
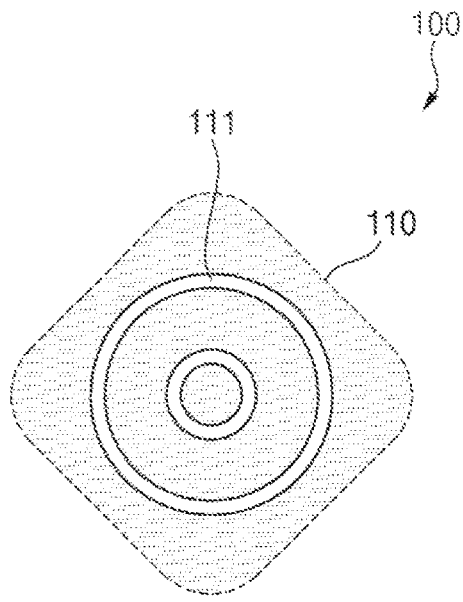
Figure 9:
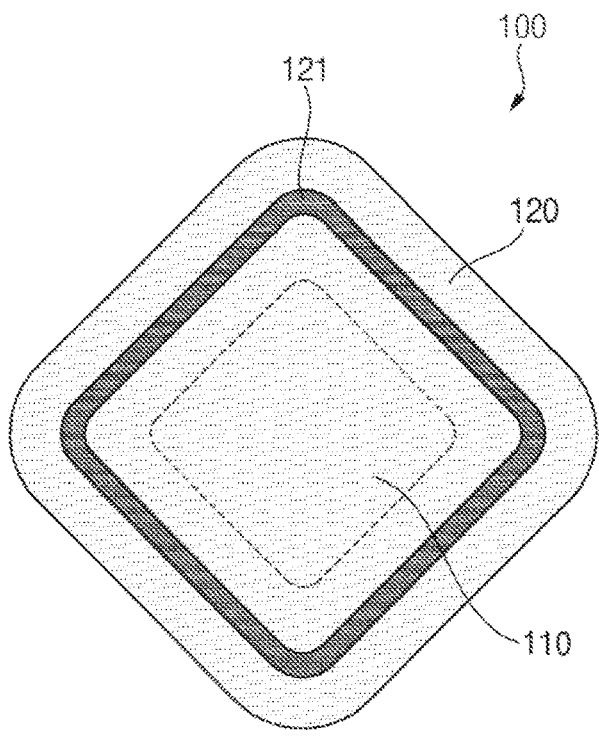
FIGS. 9 and 10 are plan views illustrating a second pattern included in the high refractive index member of FIG. 3, according to embodiments.
Figure 10:
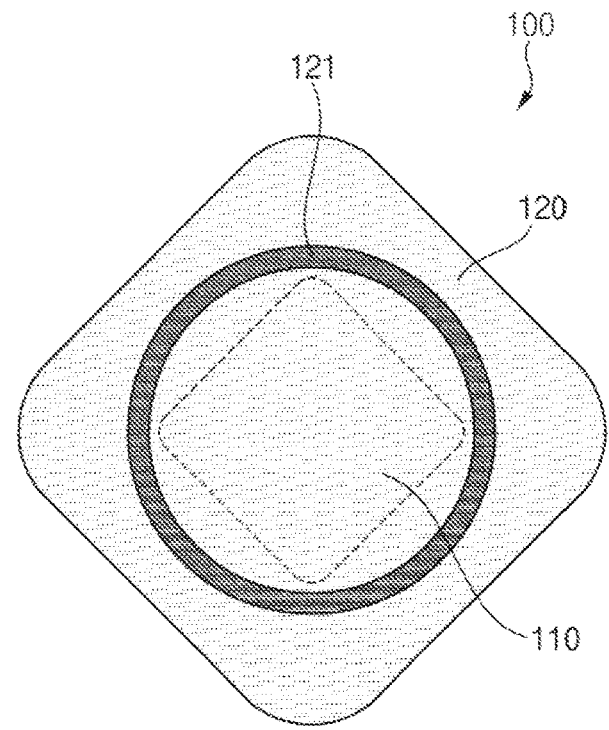

FIGS. 4 to 8 are plan views illustrating a first pattern 110 included in the high refractive index member 100 of FIG. 3, according to embodiments, and FIGS. 9 and 10 are plan views illustrating a second pattern 120 included in the high refractive index member 100, relative to the first pattern 110, of FIG. 3, according to an embodiment.

The high refractive index member 100 may form a discrete pattern which is covered by the low refractive index member 200. The concave portion 111 may not penetrate a thickness of the first pattern 110, such as to form a recess in the body of the first pattern 110. Each of the various convex portions may protrude from a common base layer of the first pattern 110, such that the convex portions are connected to each other via the base layer.

Figure 4:
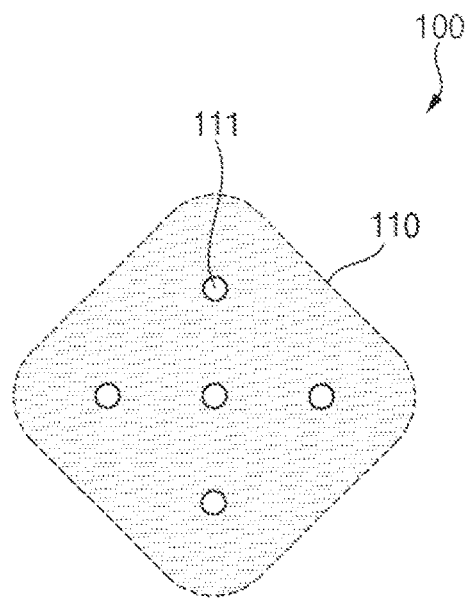
FIGS. 4 to 8 are plan views illustrating a first pattern included in the high refractive index member of FIG. 3, according to embodiments.

Referring to FIG. 4, when viewed in a plan view (e.g., along the thickness direction), the concave portion 111 of the first pattern 110 may have a planar shape such as a dot shape (e.g., a discrete shape or enclosed shape).

In an embodiment, the concave portion 111 may be plural as including a plurality of concave portions 111. Also, when viewed in a plan view, the concave portion 111 may be spaced apart from each other. In addition, when viewed in a plan view, any one of the concave portions 111 is located at a center point of the first pattern 110, and the rest of the concave portions 111 (e.g., a remainder of the concave portions 111) may be positioned so as to form a symmetry with the center point within the first pattern 110.

Figure 5:
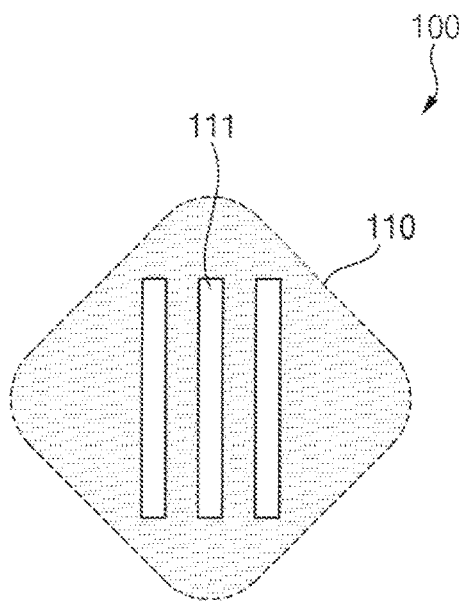

Referring to FIG. 5, when viewed in a plan view, the concave portion 111 of the first pattern 110 may have a linear shape.

Figure 6:
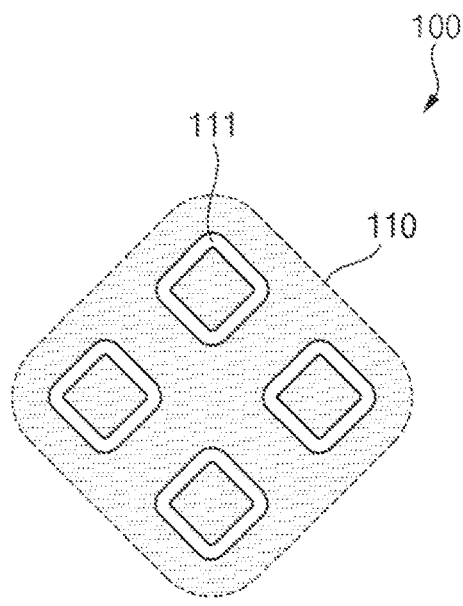

FIGS. 6 to 8, when viewed in a plan view, the concave portion 111 of the first pattern 110 may have a closed curve (or closed loop) shape. The closed curve shape may be provided in plural separated from each other (FIG. 6) or nested with each other (FIGS. 7 and 8). In an embodiment, when viewed in a plan view, the concave portion 111 may be a polygon such as a quadrangle, a pentagon, or a hexagon. In an embodiment, when viewed in a plan view, the concave portion 111 may be circular.

In an embodiment, as shown in FIG. 6, the concave portion 111 may be plural. Also, when viewed in a plan view, the center points of the respective shapes of the concave portion 111 may not coincide with each other. In other words, when viewed in a plan view, the concave portion 111 may be spaced apart from each other.

In an embodiment, as shown in FIG. 7, the concave portion 111 may have a quadrangular shape or a plurality of concave portion 111. In addition, when viewed in a plan view, the center points of the respective shapes of the concave portion 111 may coincide with each other. In other words, when viewed in a plan view, any one of the concave portion 111 may surround another one of the concave portion 111.

In an embodiment, as shown in FIG. 8, the concave portion 111 may be circular, and the concave portion 111 may be plural. In addition, when viewed in a plan view, the center points of the respective shapes of the concave portion 111 may coincide with each other. In other words, when viewed in a plan view, any one of the concave portion 111 may surround another one of the concave portion 111.

However, the number, size, and shape of the concave portion 111 are not limited to the concave portion 111 described with reference to FIGS. 4 to 8.

In an embodiment, when viewed in a plan view, the high refractive index member 100 may be plural to define a high refractive index member layer including a plurality of patterns. The plurality of patterns may have different shapes from each other. In an embodiment, for example, when viewed in a plan view, the first pattern 110 included in any one of the high refractive index member 100 and the first pattern 110 included in the other one of the high refractive index member 100 within the high refractive index member layer, may be different from each other. In an embodiment, for example, when viewed in a plan view, a first pattern 110 included in any one of the high refractive index member 100 may be the same as the first pattern 110 shown in FIG. 4, and a first pattern 110 included in the other one of the high refractive index member 100 may be the same as the first pattern 110 illustrated in FIG. 5.

Referring to FIGS. 9 and 10, when viewed in a plan view, the convex portion 121 of the second pattern 120 may surround the first pattern 110. That is, the convex portion 121 of the second pattern 120 of the high refractive index member 100 extends along the first pattern 110 and surrounds the first pattern 110.

In an embodiment, when viewed in a plan view, the convex portion 121 may be a polygon such as a quadrangle, a pentagon, or a hexagon. As shown in FIG. 9, the convex portion 121 may have a quadrangular shape. In addition, the convex portion 121 may be plural. In this case, when viewed in a plan view, the central points of the respective shapes of the convex portion 121 may coincide with each other. In other words, when viewed in a plan view, any one of the convex portion 121 may surround another one of the convex portion 121.

In an embodiment, when viewed in a plan view, the convex portion 121 may be circular. As shown in FIG. 10, the convex portion 121 may have a circular shape. In addition, the convex portion 121 may be plural. In this case, when viewed in a plan view, the central points of the respective shapes of the convex portion 121 may coincide with each other. In other words, when viewed in a plan view, any one of the convex portion 121 may surround another one of the convex portion 121.

However, the number, size, and shape of the convex portion 121 are not limited by FIGS. 9 and 10.

Figure 11:
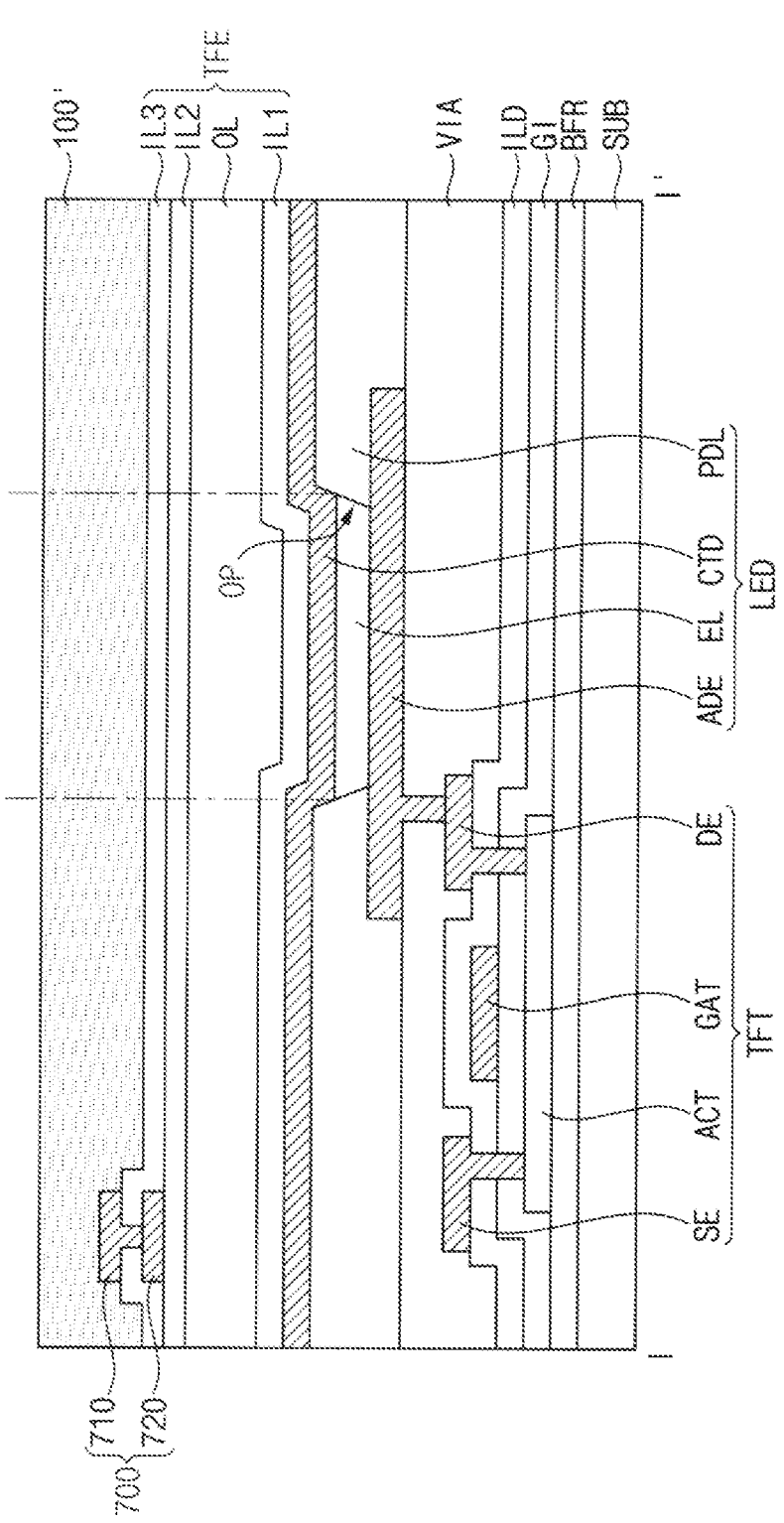
Figure 12:
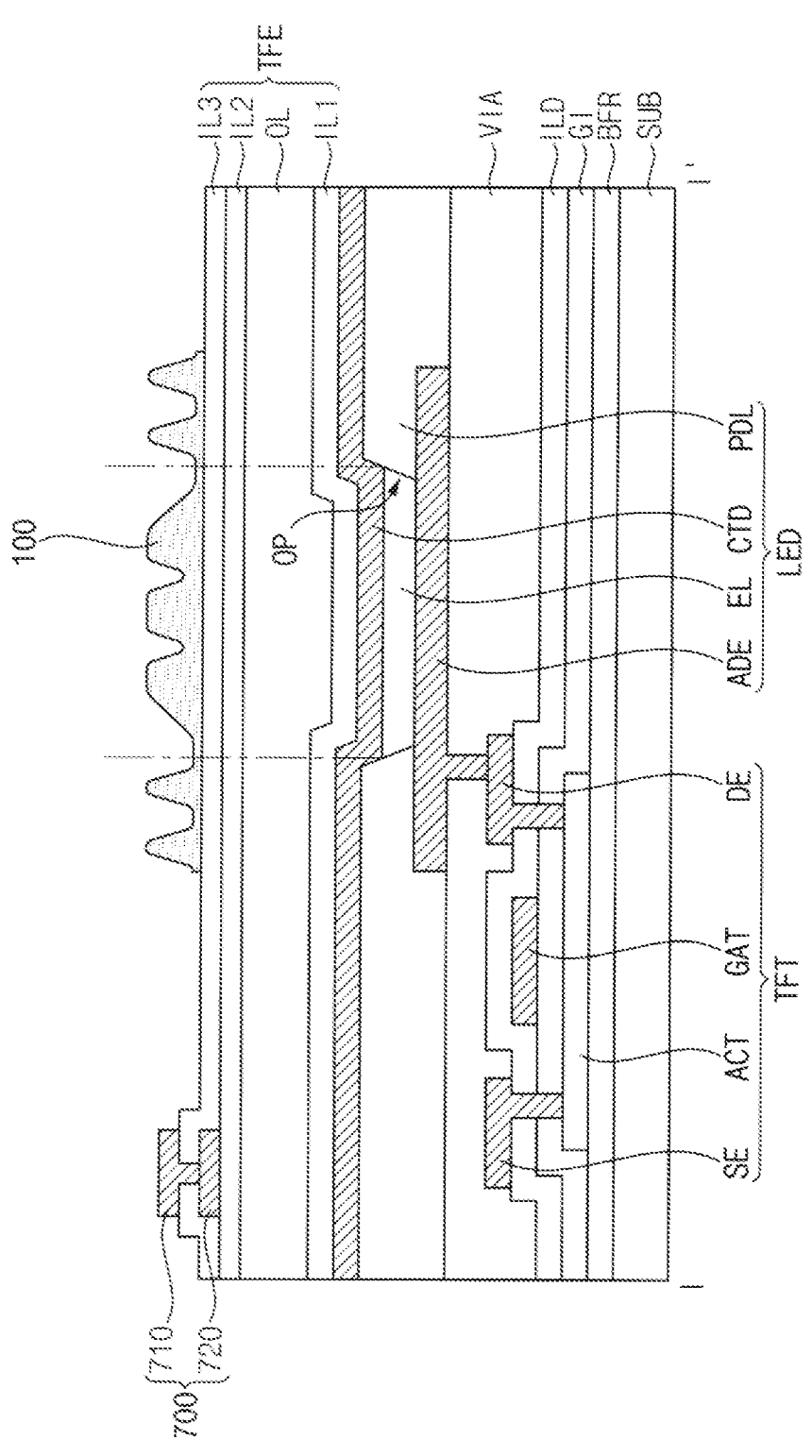
Figure 13:
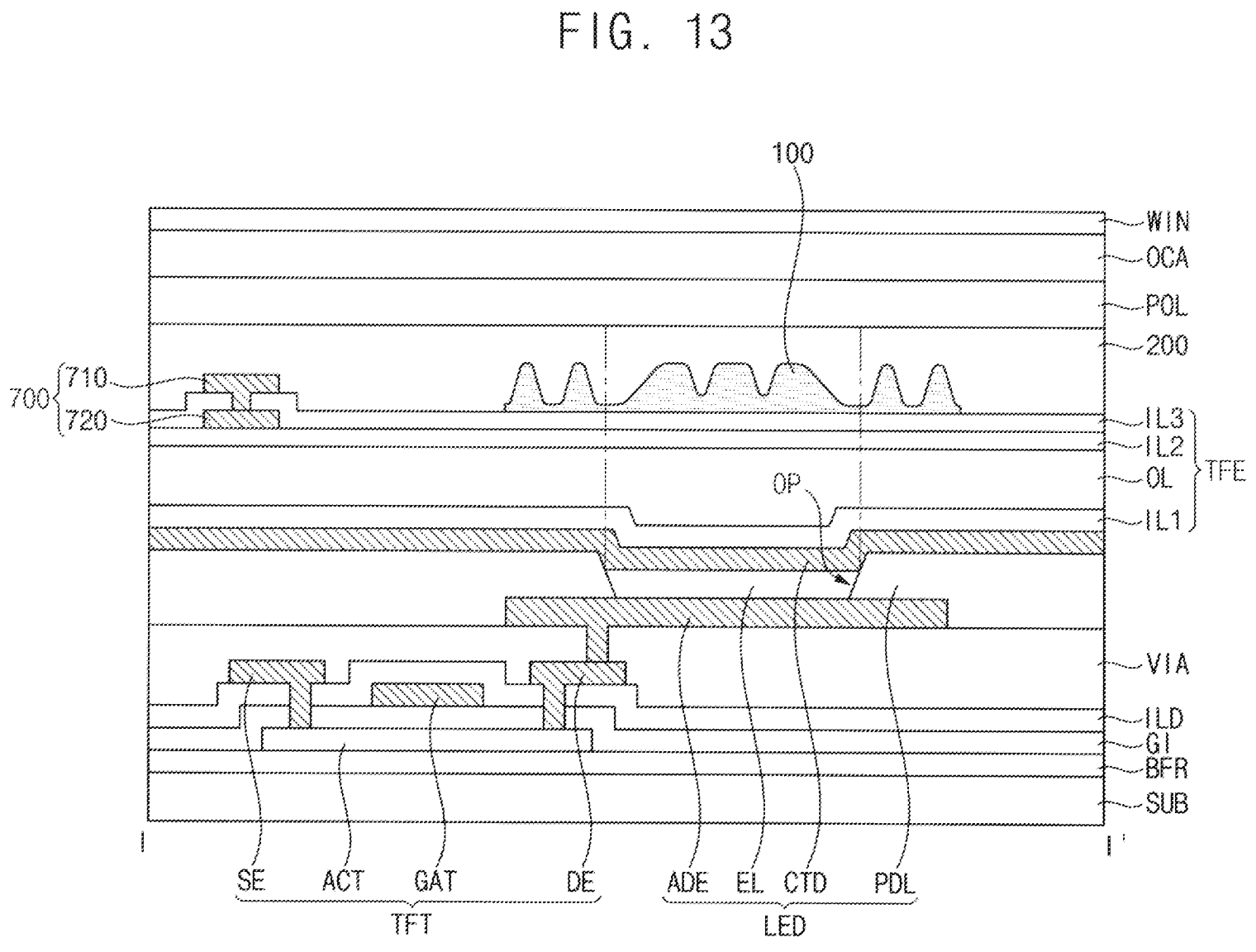

FIGS. 11 to 13 are cross-sectional views illustrating a method of manufacturing (or providing) the display device 1000 of FIG. 1, according to an embodiment.

Referring to FIG. 11, the light emitting structure LED may be formed (or provided) on the substrate SUB, and a first refractive layer 100' (e.g., first refractive index material layer) may be formed on the third inorganic layer IL3 and the second touch electrode 720. The first refractive layer 100' may be formed of an organic material, and may be entirely disposed on the third inorganic layer IL3 (e.g., disposed on an entirety of the third inorganic layer IL3).

Referring to FIG. 12, the first refractive layer 100' may be patterned, and the high refractive index member 100 may be formed. In an embodiment, the first refractive layer 100' may be patterned through a photolithography process. In an embodiment, for example, a mask may be disposed on the first refractive layer 100' to be spaced apart from the first refractive layer 100', and ultraviolet rays may be irradiated toward the mask. The ultraviolet rays may be irradiated to the first refractive layer 100' along the pattern of the mask, and a portion of the first refractive layer 100' may be removed. Accordingly, the high refractive index member 100 may be formed as a remainder of the first refractive layer 100'. The high refractive index member 100 may be formed to have any one of the shapes described with reference to FIGS. 3 to 10.

Referring to FIG. 13, the first refractive layer 100' may be patterned to provide the high refractive index member 100, and the low refractive index member 200 may be formed on the high refractive index member 100. In an embodiment, a second refractive layer (e.g., second refractive index material layer) may be patterned through a photolithography process. In an embodiment, for example, a photoresist pattern may be formed on the second refractive layer, and ultraviolet rays may be irradiated to form the low refractive index member 200 from the second refractive layer. As described above, the low refractive index member 200 may be formed to cover the high refractive index member 100.

As described above, the high refractive index member 100 may include a first pattern 110 overlapping the light emitting layer EL, and a second pattern 120 overlapping the pixel defining layer PDL. In a direction along the substrate SUB, the second pattern 120 may extend from the first pattern 110 and away from the first pattern 110 (or away from an outer edge of the light emitting layer EL). The first pattern 110 may include the concave portion 111, and the second pattern 120 may include the convex portion 121.

The low refractive index member 200 may be disposed on the high refractive index member 100 (e.g., further from the light emitting layer EL than the high refractive index member 100) and cover the high refractive index member 100. Also, the low refractive index member 200 may have the second refractive index smaller than the first refractive index of the high refractive index member 100. The concave portion 111 of the first pattern 110 may refract incident light directed to the concave portion 111 to be directed in the normal direction of the substrate SUB. In addition, the convex portion 121 of the second pattern 120 may refract other incident light directed to the convex portion 121 to be directed in the normal direction of the substrate SUB. Accordingly, the light emitted from the light emitting structure LED may be emitted to the front of the display device 1000, and the light efficiency of the display device 1000 may be improved.

Figure 14:
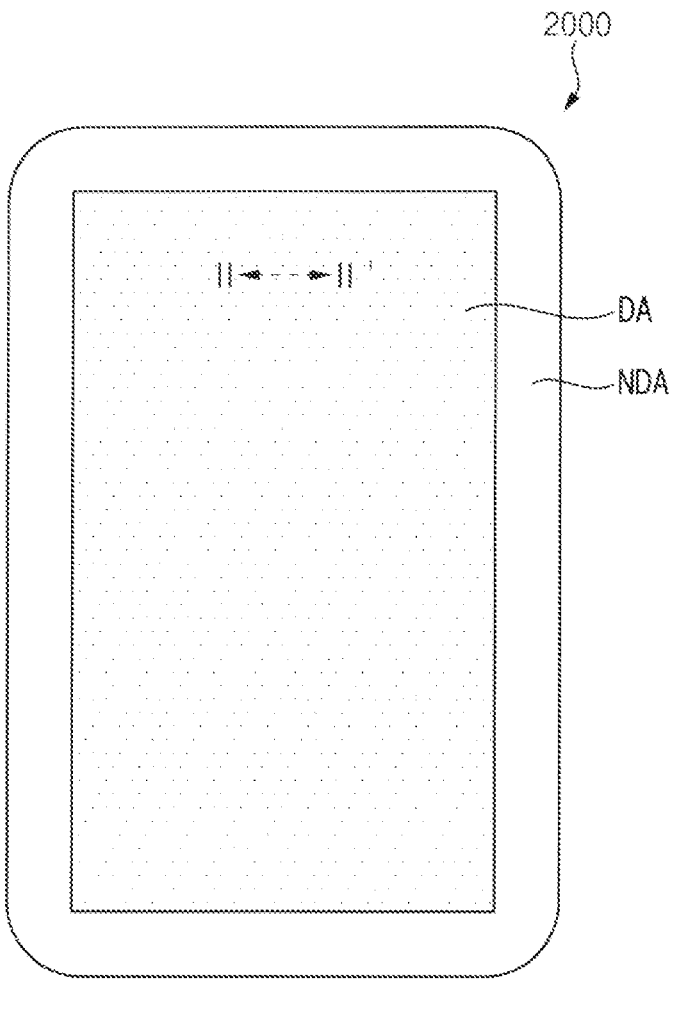
FIG. 14 is a plan view illustrating a display device according to an embodiment
Figure 15:
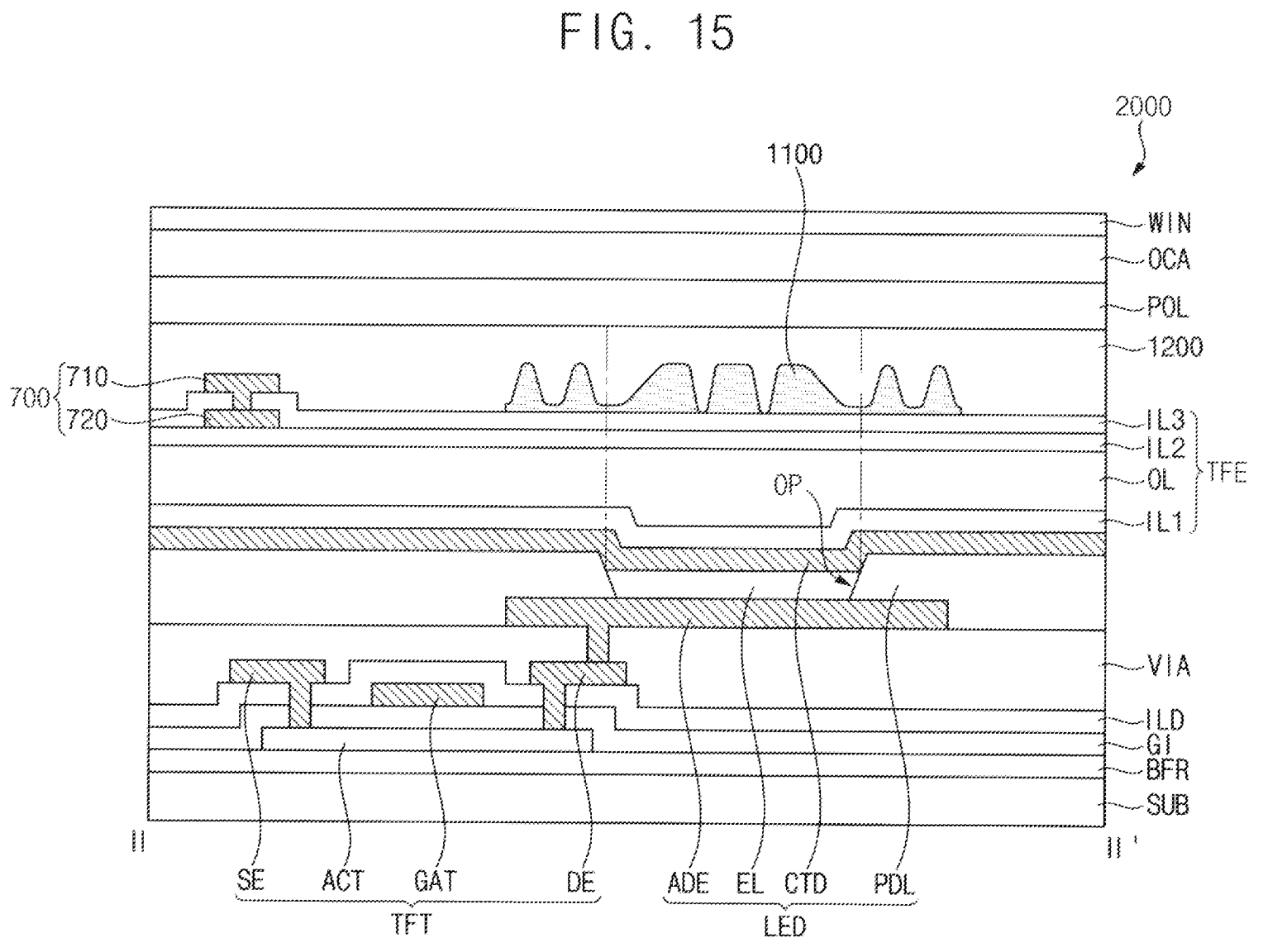

FIG. 14 is a plan view illustrating a display device 2000 according to an embodiment, and FIG. 15 is a cross-sectional view illustrating the display device 2000 of FIG. 14. In an embodiment, for example, FIG. 15 is a cross-sectional view taken along line II-II' of FIG. 14.

Referring to FIGS. 14 and 15, a display device 2000 according to an embodiment includes the substrate SUB, the buffer layer BFR, the active pattern ACT, the gate insulating layer GI, the gate electrode GAT, the interlayer insulating layer ILD, the source electrode SE, the drain electrode DE, the via insulating layer VIA, the first electrode ADE, the pixel defining layer PDL, the light emitting layer EL, the second electrode CTD, the first inorganic layer IL1, the organic layer OL, the second inorganic layer IL2, the first touch electrode 710, the third inorganic layer IL3, the second touch electrode 720, a high refractive index member 1100, a low refractive index member 1200, the polarization layer POL, the adhesive layer OCA, and the window WIN may include.

However, the display device 2000 may be substantially the same as the display device 1000 described with reference to FIG. 2, except for the shapes of the high refractive index member 1100 and the low refractive index member 1200.

Figure 16:
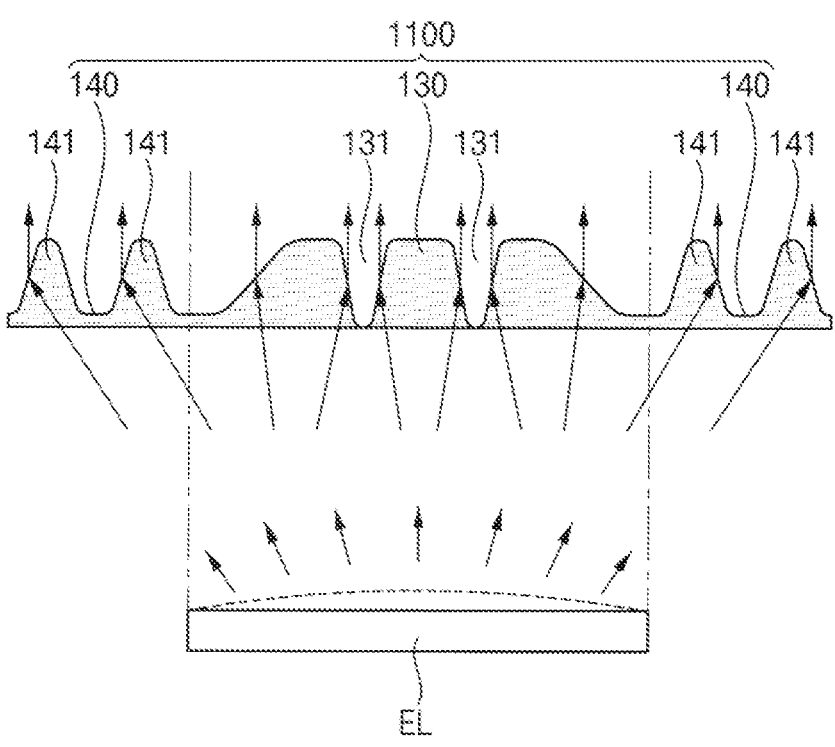
FIG. 16 is a view illustrating a light emitting layer and a high refractive index member included in the display device of FIG. 15.

FIG. 16 is a view illustrating a light emitting layer EL and a high refractive index member 1100 which faces the light emitting layer EL, included in the display device 2000 of FIG. 15.

Referring to FIGS. 15 and 16, the high refractive index member 1100 may include a first pattern 130 overlapping the light emitting layer EL and a second pattern 140 overlapping the pixel defining layer PDL (e.g., not overlapping the light emitting layer EL or adjacent to the light emitting layer EL).

The first pattern 130 may include at least one concave portion 131 recessed in a cross-section. In an embodiment, the concave portion 131 may be singular. In an embodiment, the concave portion 131 may be plural.

The high refractive index member 1100 may have a lower surface which is furthest from the low refractive index member 200. A bottom of the concave portion 131 defined in the first pattern 130 may be in contact with or be coplanar with the lower surface of the high refractive index member 1100. Accordingly, when viewed in cross-section, the shape of the concave portion 131 may be different from the shape of the concave portion 111 described with reference to FIG. 3. However, when viewed in a plan view, the shape of the concave portion 131 may be the same as the shape of the concave portion 111 described with reference to FIGS. 4 to 8.

As shown in FIGS. 15 and 16, the concave portion 131 may meet an upper surface of an underlying layer, such as the third inorganic layer IL3. The upper surface of the underlying layer may be furthest from the substrate SUB. The underlying layer may be exposed to outside the high refractive index member 1100, at the concave portion 131. The concave portion 131 may penetrate a thickness of the high refractive index member 1100. Portions of the first pattern 130 may be disconnected from each other at the concave portion 131, without being limited thereto.

The second pattern 140 may include at least one convex portion 141 protruding from a base layer and in a direction away from the light emitting structure LED, in the cross-section. In an embodiment, the convex portion 141 may be singular. In an embodiment, the convex portion 141 may be plural.

When viewed in a plan view, the shape of the convex portion 141 may be the same as the shape of the convex portion 121 described with reference to FIGS. 9 to 10.

Within the second pattern 140, respective concave portions may not penetrate a thickness of the second pattern 140, such as to form a recess in the body of the second pattern 140. Within the second pattern 140, each of the various convex portions may protrude from a common base layer of the second pattern 140, such that the convex portions are connected to each other via the base layer. A portion of the base layer may be extended from the second pattern 140 and to the first pattern 130, to connect the second pattern 140 to the first pattern 130 at an outermost portion of the first pattern 130.

The light emitting layer EL may emit the light in a plurality of directions, including the normal direction of the substrate SUB. Referring to FIG. 16, for example, the light emitting layer EL may emit incident light toward the concave portion 131 of the first pattern 130. Referring again to FIG. 16, for example, the light emitting layer EL may emit other incident light directed to the convex portion 141 of the second pattern 140.

As described above, the high refractive index member 1100 may include a first pattern 130 overlapping the light emitting layer EL, and a second pattern 140 overlapping the pixel defining layer PDL. The first pattern 130 may include the concave portion 131, and the second pattern 140 may include the convex portion 141.

The low refractive index member 1200 may be disposed facing the high refractive index member 1100 and covering the high refractive index member 1100. Also, the low refractive index member 1200 may have the second refractive index smaller than the first refractive index of the high refractive index member 1100. The concave portion 131 of the first pattern 130 may refract incident light directed to the concave portion 131 to be directed in the normal direction of the substrate SUB. In addition, the convex portion 141 of the second pattern 140 may refract other incident light directed to the convex portion 141 to be directed in the normal direction of the substrate SUB. Accordingly, the light may be emitted to the front of the display device 2000 in a light emitting direction from the light emitting structure LED to the window WIN, and the light efficiency of the display device 2000 may be improved.

Figure 17:
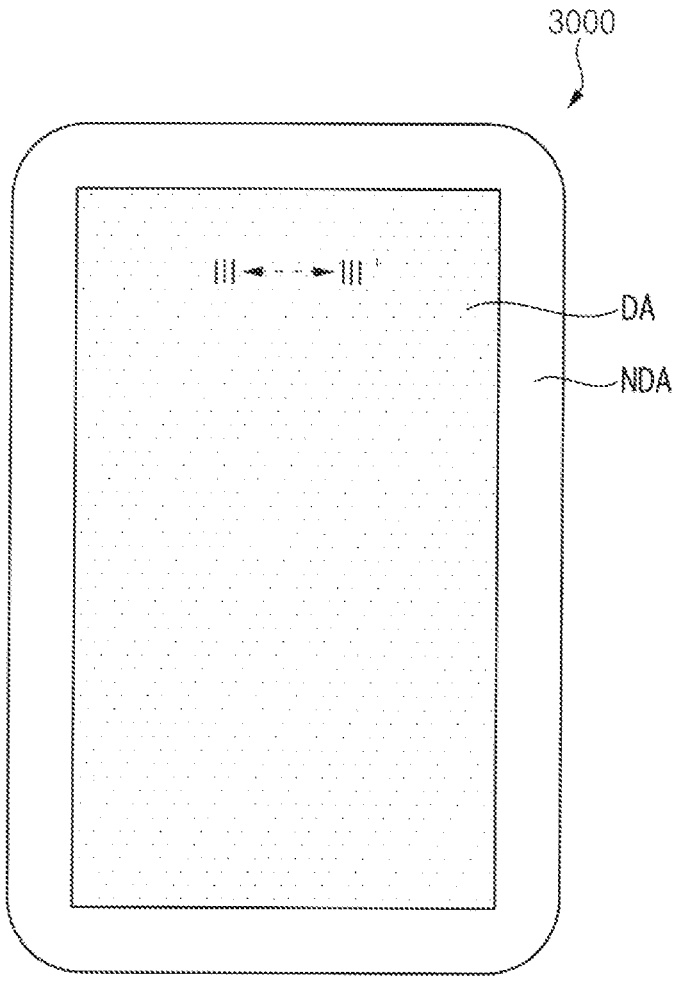
FIG. 17 is a plan view illustrating a display device according to an embodiment
Figure 18:
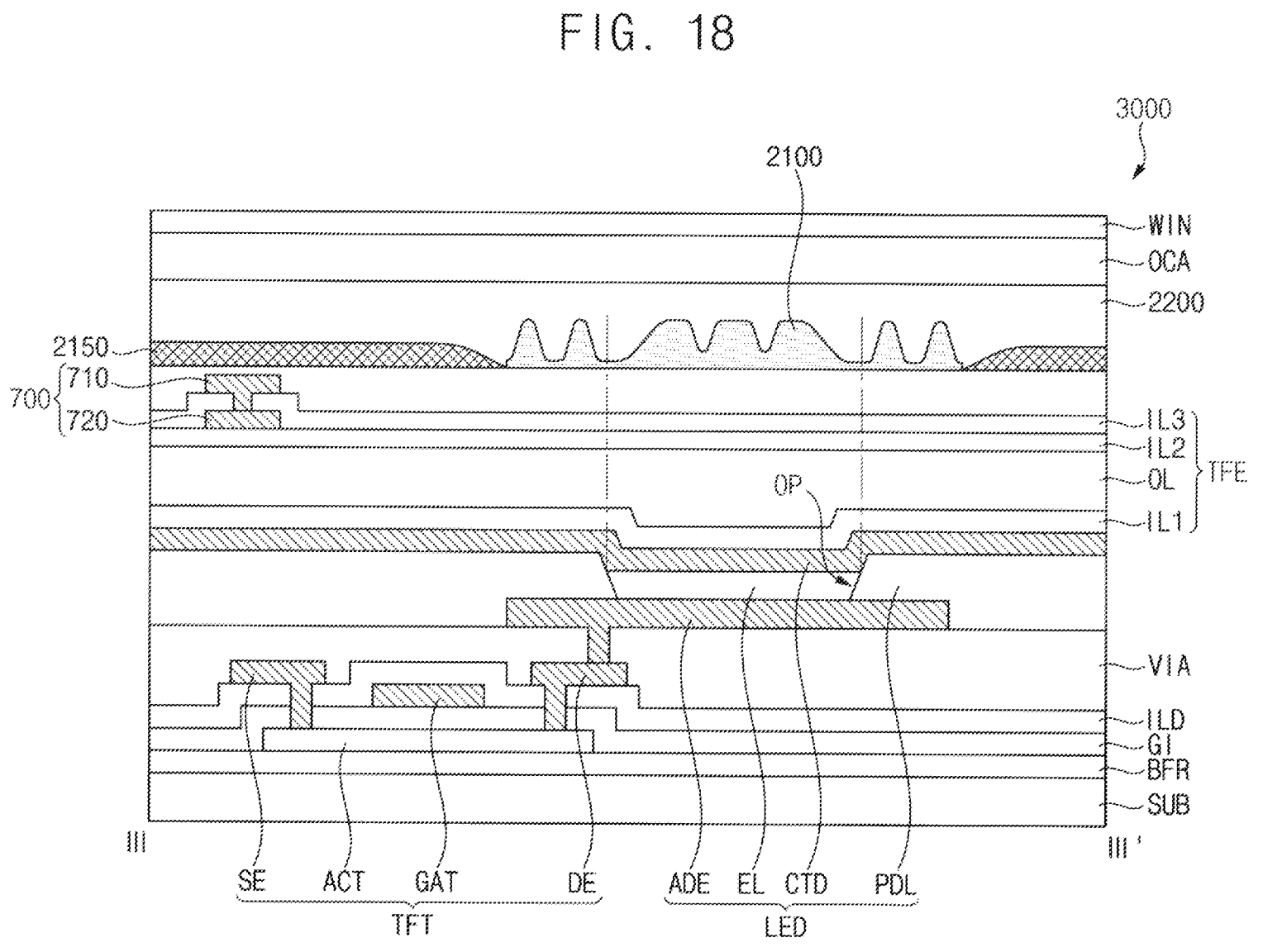

FIG. 17 is a plan view illustrating a display device 3000 according to an embodiment, and FIG. 18 is a cross-sectional view illustrating the display device 3000 of FIG.

17. In an embodiment, for example, FIG. 18 is a cross-sectional view taken along line of FIG. 17.

Referring to FIGS. 17 and 18, a display device 3000 according to an embodiment includes the substrate SUB, the buffer layer BFR, the active pattern ACT, the gate insulating layer GI, the gate electrode GAT, the interlayer insulating layer ILD, the source electrode SE, the drain electrode DE, the via insulating layer VIA, the first electrode ADE, and the pixel defining layer PDL, the light emitting layer EL, the second electrode CTD, the first inorganic layer ILL the organic layer OL, the second inorganic layer IL2, the first touch electrode 710, the third inorganic layer IL3, the second touch electrode 720, a color filter 2100, a black matrix 2150, a low refractive index member 2200, the adhesive layer OCA, and the window WIN.

However, the display device 3000 may not include the polarization layer POL described with reference to FIG. 2. The color filter 2100 blocks light having a predetermined wavelength to improve color reproducibility of the display device 3000.

The black matrix 2150 may be disposed on the sensing layer 700 and overlap the pixel defining layer PDL.

As described above, the display device 3000 may include the color filter 2100 and the black matrix 2150 instead of the polarization layer POL described with reference to FIG. 2.

Figure 19:
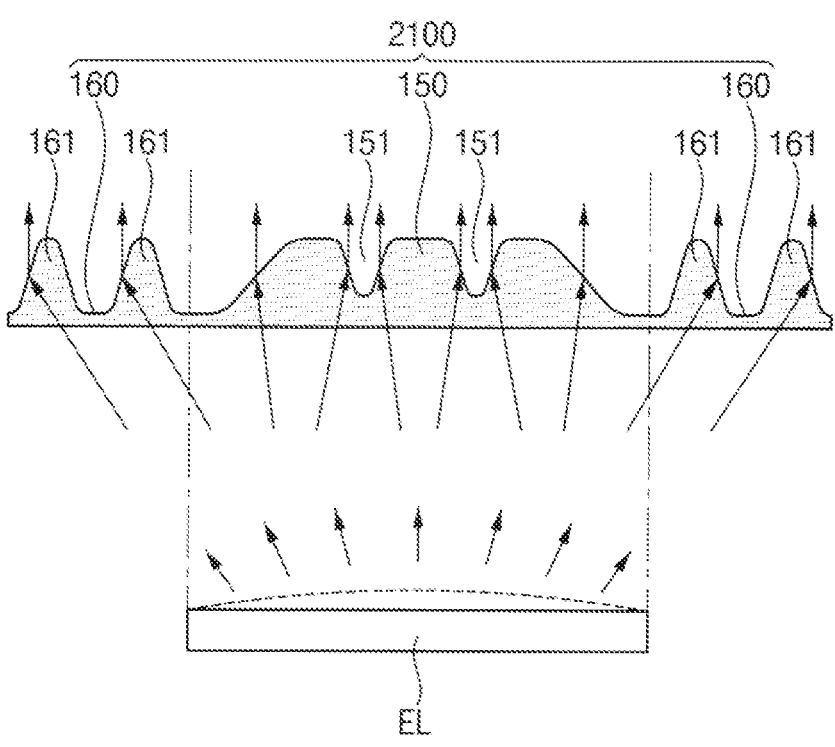
FIG. 19 is a diagram illustrating a light emitting layer and a color filter included in the display device of FIG. 18.

FIG. 19 is a diagram illustrating a light emitting layer EL and a color filter 2100 included in the display device 3000 of FIG. 18.

Referring to FIGS. 18 and 19, the color filter 2100 may be disposed on the light emitting layer EL. In an embodiment, for example, the color filter 2100 may be disposed on the sensing layer 700 described with reference to FIG. 2.

The color filter 2100 may include a first pattern 150 overlapping the light emitting layer EL, and a second pattern 160 overlapping the pixel defining layer PDL.

The first pattern 150 may include at least one concave portion 151 recessed in a cross-section. In an embodiment, the concave portion 151 may be singular. In an embodiment, the concave portion 151 may be plural.

When viewed in a plan view, the shape of the concave portion 151 may be the same as that of the concave portion 111 described with reference to FIGS. 4 to 8.

The second pattern 160 may include at least one convex portion 161 protruding from the cross-section. In an embodiment, the convex portion 161 may be singular. In an embodiment, the convex portion 161 may be plural.

When viewed in a plan view, the shape of the convex portion 161 may be the same as that of the convex portion 121 described with reference to FIGS. 9 to 10.

The low refractive index member 2200 may be disposed on the color filter 2100 and cover the color filter 2100.

The color filter 2100 may have a first refractive index. Also, the low refractive index member 2200 may have a second refractive index smaller than the first refractive index of the color filter 2100.

The light emitting layer EL may emit the light in a plurality of directions including the normal direction of the substrate SUB. Referring to FIG. 19, for example, the light emitting layer EL may emit incident light directed to the concave portion 151 of the first pattern 150. Referring again to FIG. 19, for example, the light emitting layer EL may emit other incident light directed to the convex portion 161 of the second pattern 160.

As described above, the color filter 2100 may include a first pattern 150 overlapping the light emitting layer EL, and a second pattern 160 overlapping the pixel defining layer PDL. The first pattern 150 may include the concave portion 151, and the second pattern 160 may include the convex portion 161.

The low refractive index member 2200 may be disposed on the color filter 2100 and cover the color filter 2100. Also, the low refractive index member 2200 may have the second refractive index smaller than the first refractive index of the color filter 2100. The concave portion 151 of the first pattern 150 may refract incident light directed to the concave portion 151 to be directed in the normal direction of the substrate SUB. In addition, the convex portion 161 of the second pattern 160 may refract other incident light directed to the convex portion 161 to be directed in the normal direction of the substrate SUB. Accordingly, the light may be emitted to the front of the display device 3000, and the light efficiency of the display device 3000 may be improved.

In an embodiment, the first refractive index of the color filter 2100 may be about 1.6 or more. Also, the low refractive index member 2200 may be a solid material portion or may be air.

Figure 20:
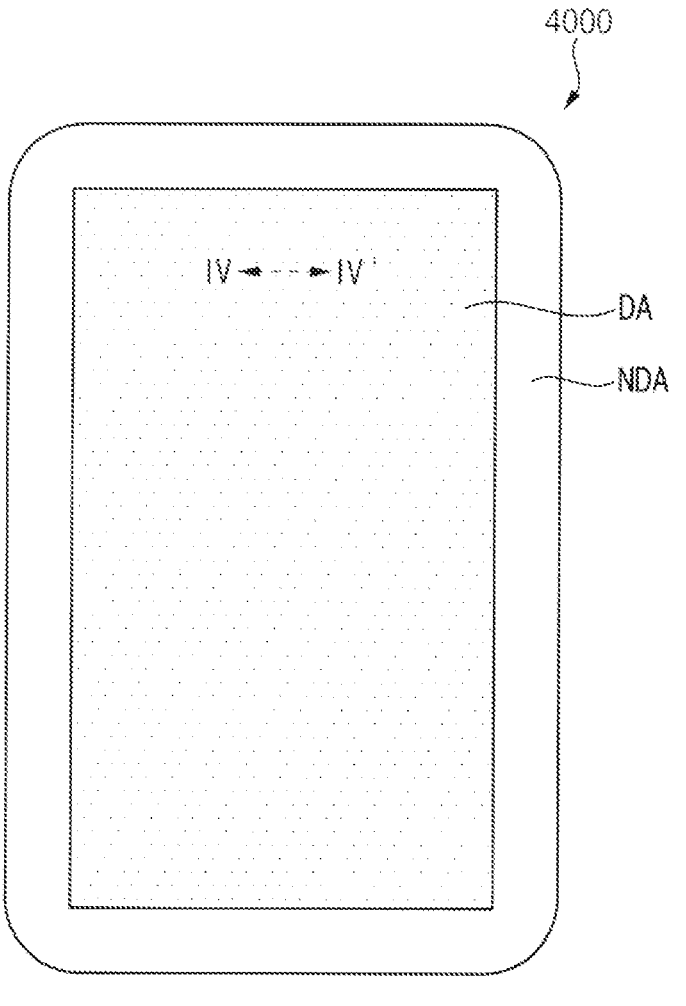
FIG. 20 is a plan view illustrating a display device according to an embodiment
Figure 21:
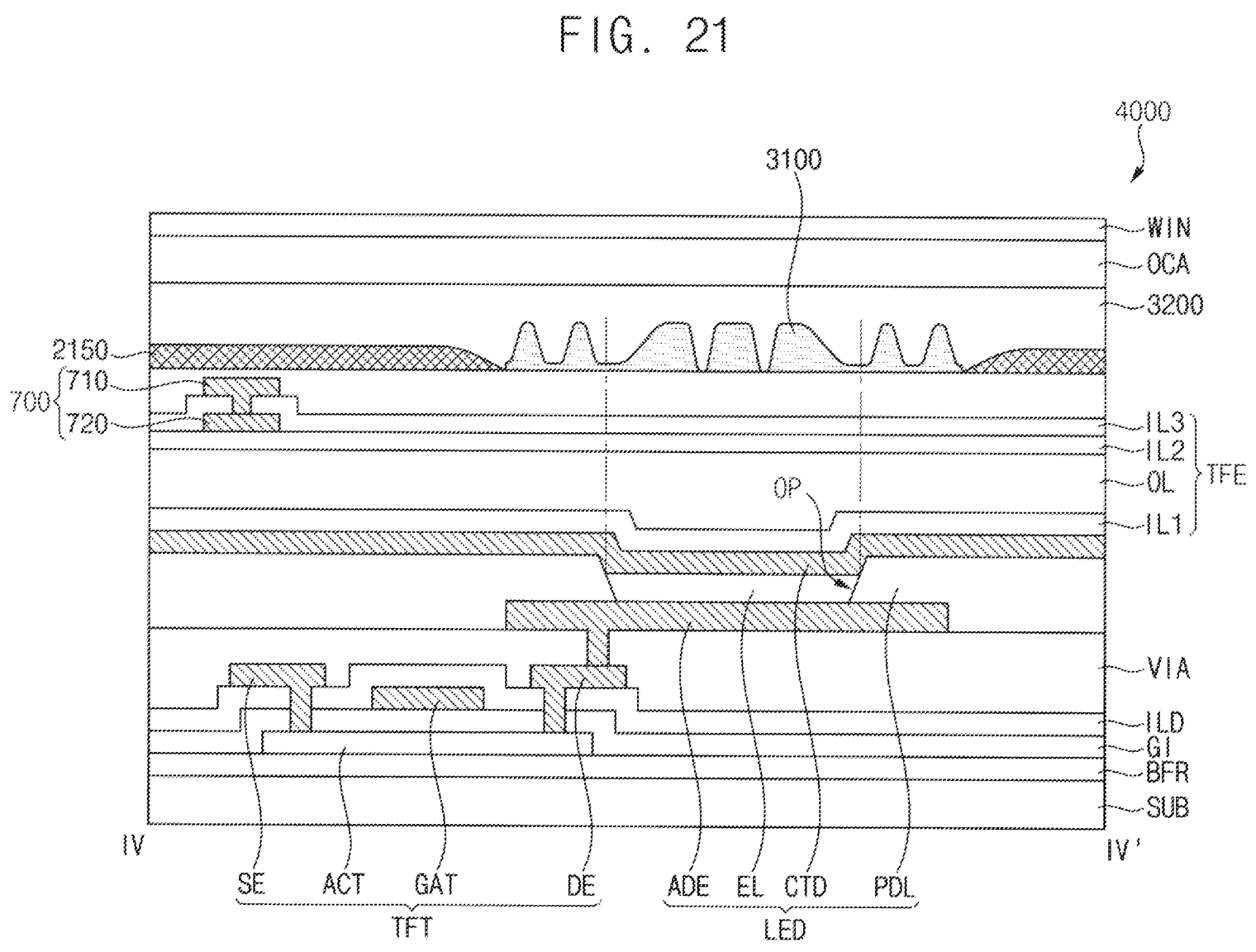

FIG. 20 is a plan view illustrating a display device 4000 according to an embodiment, and FIG. 21 is a cross-sectional view illustrating the display device 4000 of FIG. 20. In an embodiment, for example, FIG. 21 is a cross-sectional view taken along line IV-IV' of FIG. 20.

Referring to FIGS. 20 and 21, a display device 4000 according to an embodiment may include the substrate SUB, the buffer layer BFR, the active pattern ACT, the gate insulating layer GI, the gate electrode GAT, the interlayer insulating layer ILD, the source electrode SE, the drain electrode DE, the via insulating layer VIA, the first electrode ADE, and the pixel defining layer PDL, the light emitting layer EL, the second electrode CTD, the first inorganic layer IL1, the organic layer OL, the second inorganic layer IL2, the first touch electrode 710, the third inorganic layer IL3, the second touch electrode 720, a color filter 3100, the black matrix 2150, a low refractive index member 3200, the adhesive layer OCA, and the window WIN.

However, the display device 4000 may be substantially the same as the display device 3000 described with reference to FIGS. 17 and 18, except for the shapes of the color filter 3100 and the low refractive index member 3200.

Figure 22:
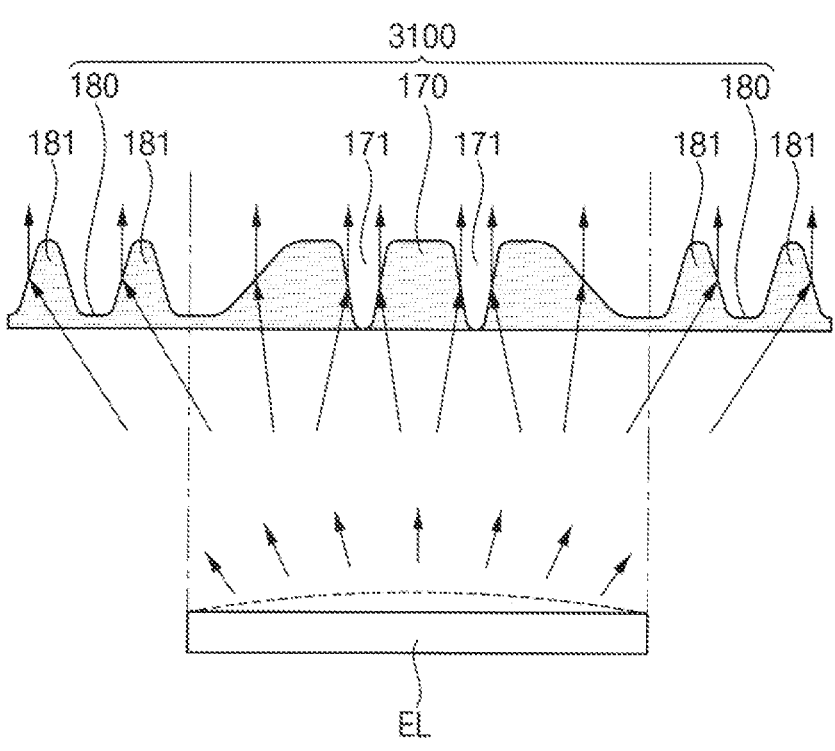
FIG. 22 is a diagram illustrating a light emitting layer and a color filter included in the display device of FIG. 21.

FIG. 22 is a diagram illustrating a light emitting layer EL and a color filter 3100 included in the display device 4000 of FIG. 21.

Referring to FIGS. 21 and 22, the color filter 3100 may include a first pattern 170 overlapping the light emitting layer EL, and a second pattern 180 overlapping the pixel defining layer PDL.

The first pattern 170 may include at least one concave portion 171 recessed in a cross-section. In an embodiment, the concave portion 171 may be singular. In an embodiment, the concave portion 171 may be plural.

The color filter 3100 may have a lower surface. The concave portion 171 of the first pattern 170 may be in contact with the lower surface of the color filter 3100. Accordingly, when viewed in cross section, the shape of the concave portion 171 may be different from the shape of the concave portion 111 described with reference to FIG. 3. However, when viewed in a plan view, the shape of the concave portion 171 may be the same as that of the concave portion 111 described with reference to FIGS. 4 to 8.

The second pattern 180 may include at least one convex portion 181 protruding from the cross-section. In an embodiment, the convex portion 181 may be singular. In an embodiment, the convex portion 181 may be plural.

When viewed in a plan view, the shape of the convex portion 181 may be the same as the shape of the convex portion 121 described with reference to FIGS. 9 to 10.

The light emitting layer EL may emit the light in a plurality of directions, including the normal direction of the substrate SUB. Referring to FIG. 22, for example, the light emitting layer EL may emit incident light directed to the concave portion 171 of the first pattern 170. Referring again to FIG. 22, for example, the light emitting layer EL may emit other incident light directed to the convex portion 181 of the second pattern 180.

As described above, the color filter 3100 may include a first pattern 170 overlapping the light emitting layer EL, and a second pattern 180 overlapping the pixel defining layer PDL. The first pattern 170 may include the concave portion 171, and the second pattern 180 may include the convex portion 181.

The low refractive index member 3200 may be disposed on the color filter 3100 and cover the color filter 3100. Also, the low refractive index member 3200 may have the second refractive index smaller than the first refractive index of the color filter 3100. The concave portion 171 of the first pattern 170 may refract incident light directed to the concave portion 171 to be directed in the normal direction of the substrate SUB. In addition, the convex portion 181 of the second pattern 180 may refract other incident light directed to the convex portion 181 to be directed in the normal direction of the substrate SUB. Accordingly, the light may be emitted to the front of the display device 4000, and the light efficiency of the display device 4000 may be improved.

In an embodiment, the first refractive index of the color filter 3100 may be about 1.6 or more. Also, the low refractive index member 3200 may be a solid material portion or may be air.

Although embodiments and implementations have been described herein, other embodiments and modifications will be apparent from this description. Accordingly, the invention is not limited to such embodiments, but rather to the broader scope of the appended claims and various obvious modifications and equivalent arrangements as would be apparent to a person of ordinary skill in the art.

What is claimed is:

1. A display device comprising:
   a light emitting element including a light emitting layer;
   a high refractive index member facing the light emitting layer, the high refractive index member having a first refractive index and including a first pattern defining a concave portion of the high refractive index member; and
   a low refractive index member facing the light emitting layer with the high refractive index member therebetween, the low refractive index member having a second refractive index smaller than the first refractive index of the high refractive index member,
   wherein the concave portion of the first pattern overlaps the light emitting layer of the light emitting element.

2. The display device of claim 1, wherein
   the high refractive index member has a lower surface which is furthest from the low refractive index member, and
   a bottom of the concave portion of the first pattern of the high refractive index member is coplanar with the lower surface of the high refractive index member.

3. The display device of claim 1, wherein the concave portion of the first pattern of the high refractive index member has a planar shape of a dot shape.

4. The display device of claim 1, wherein the concave portion of the first pattern of the high refractive index member has a planar shape of a linear shape.

5. The display device of claim 1, wherein the concave portion of the first pattern of the high refractive index member has a planar shape of a closed loop shape.

6. The display device of claim 1, wherein within the high refractive index member, the concave portion of the first pattern is provided in plural.

7. The display device of claim 1, wherein
the light emitting element further includes:
    the light emitting layer including an outer edge, and
    a pixel defining layer extending from the outer edge of the light emitting layer, and
the high refractive index member further includes:
    the first pattern including an outer edge corresponding to the outer edge of the light emitting layer,
    a second pattern extending from the outer edge of the first pattern and facing the pixel defining layer, and
    the second pattern defining a convex portion of the high refractive index member.

8. The display device of claim 7, wherein
each of the first pattern and the second pattern of the high refractive index member has a planar shape, and
the planar shape of the convex portion of the second pattern extends along the planar shape of the first pattern and surrounds the first pattern.

9. The display device of claim 8, further comprising a substrate facing the high refractive index member with the light emitting layer therebetween,
wherein
the light emitting layer emits an incident light toward the convex portion of the second pattern of the high refractive index member, and
the convex portion of the second pattern of the high refractive index layer refracts the incident light to a normal direction of the substrate.

10. The display device of claim 7, wherein within the high refractive index member, the convex portion of the second pattern is provided in plural.

11. The display device of claim 1, wherein the first refractive index of the high refractive index member is about 1.6 or more.

12. The display device of claim 1, wherein each of the high refractive index member and the low refractive index member includes an organic material.

13. A display device comprising:
a light emitting element including a light emitting layer;
a color filter facing the light emitting layer, the color filter having a first refractive index and including a first pattern defining a concave portion of the color filter; and
a low refractive index member facing the light emitting layer with the color filter therebetween, the low refractive index member having a second refractive index smaller than the first refractive index of the color filter.

14. The display device of claim 13, wherein
the color filter has a lower surface which is furthest from the low refractive index member, and
a bottom of the concave portion of the first pattern of the color filter is coplanar with the lower surface of the color filter.

15. The display device of claim 13, wherein within the color filter, the concave portion of the first pattern is provided in plural.

16. The display device of claim 13, wherein
the light emitting element further includes:
    the light emitting layer including an outer edge, and
    a pixel defining layer extending from the outer edge of the light emitting layer, and
the color filter further includes:
    the first pattern including an outer edge corresponding to the outer edge of the light emitting layer,
    a second pattern extending from the outer edge of the first pattern and facing the pixel defining layer, and
    the second pattern defining a convex portion of the color filter.

17. The display device of claim 16, wherein
each of the first pattern and the second pattern of the color filter has a planar shape, and
the planar shape of the convex portion of the second pattern of the color filter extends along the planar shape of the first pattern and surrounds the first pattern.

18. The display device of claim 17, further comprising a substrate facing the color filter with the light emitting layer therebetween,
wherein
the light emitting layer emits an incident light toward the convex portion of the second pattern of the color filter, and
the convex portion of the second pattern of the color filter refracts the incident light to a normal direction of the substrate.

19. The display device of claim 16, wherein within the color filter, the convex portion of the second pattern is provided in plural.

20. A method of providing a display device, the method comprising:
providing a light emitting layer of a light emitting element, on a substrate;
providing a high refractive index member facing the substrate with the light emitting layer therebetween, the high refractive index member having a first refractive index and including a first pattern defining a concave portion of the high refractive index member, the concave portion overlapping the light emitting layer of the light emitting element; and
providing a low refractive index member facing the substrate with both the light emitting layer and the high refractive index member therebetween, the low refractive member having a second refractive index smaller than the first refractive index of the high refractive index member.

* * * * *